United States Patent [19]

Yaegashi

[11] Patent Number: 4,737,114

[45] Date of Patent: Apr. 12, 1988

[54] ELECTRICAL CONTACT PIN

[75] Inventor: Hirokatsu Yaegashi, Tokyo, Japan

[73] Assignee: Hirose Electric Co., Tokyo, Japan

[21] Appl. No.: 100,225

[22] Filed: Sep. 23, 1987

Related U.S. Application Data

[63] Continuation of Ser. No. 857,948, May 1, 1986.

[30] Foreign Application Priority Data

Jun. 13, 1985 [JP]  Japan .................................. 60-128444

[51] Int. Cl.⁴ .................... H01R 13/41; H01R 13/428
[52] U.S. Cl. ....................................... 439/82; 439/751
[58] Field of Search ................ 439/82, 84, 733, 751, 439/825-827, 869, 870, 873

[56] References Cited

U.S. PATENT DOCUMENTS

| | | | |
|---|---|---|---|
| 4,186,982 | 2/1980 | Cobaugh et al. | 439/82 |
| 4,513,499 | 4/1985 | Roldan | 29/874 |
| 4,606,589 | 8/1986 | Elsbree, Jr. et al. | 439/78 |

FOREIGN PATENT DOCUMENTS

| | | | |
|---|---|---|---|
| 2102394 | 7/1971 | Fed. Rep. of Germany | 439/825 |
| 3210348 | 8/1983 | Fed. Rep. of Germany | 439/751 |
| 3220781 | 12/1983 | Fed. Rep. of Germany | 439/751 |

*Primary Examiner*—Gil Weidenfeld
*Assistant Examiner*—Gary F. Paumen
*Attorney, Agent, or Firm*—Yusuke Takeuchi

[57] ABSTRACT

An electrical contact pin has a compliant part to be fitted into a plated aperture having a diameter of no more than about 0.94 mm (0.037 inch). the compliant part consists of a pair of elongated legs coming together at opposite shear ends and having generally straight inside walls which are not offset with respect to each other along a shear plane and define a thin slot. The thin slot has a length and a width which are greater than the shear ends.

3 Claims, 3 Drawing Sheets

FIG. 1
FIG. 4A
FIG. 4B
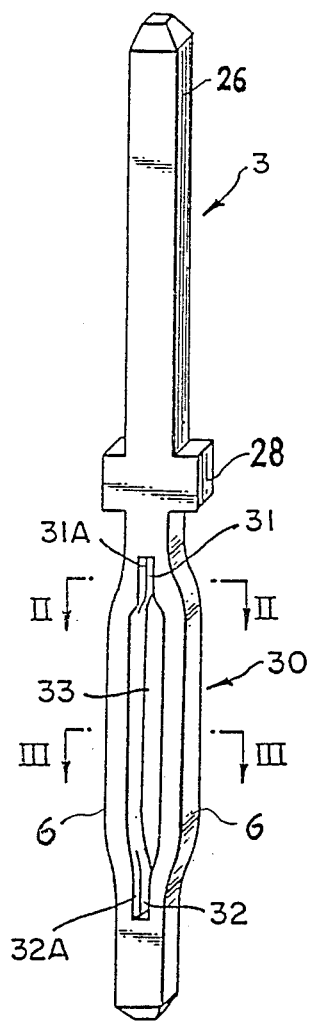
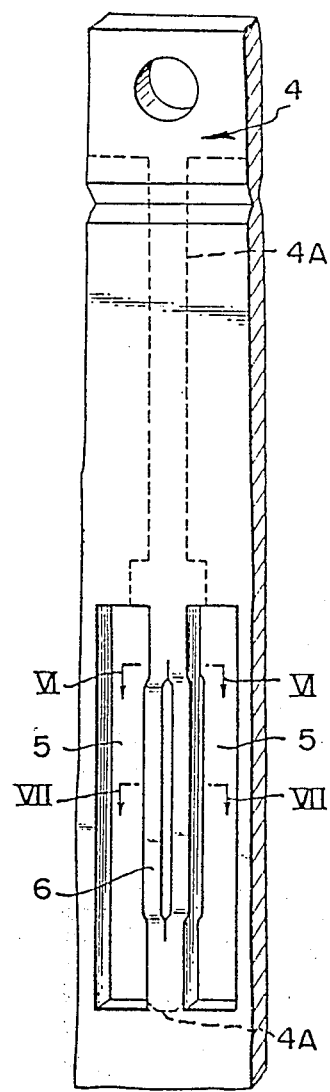
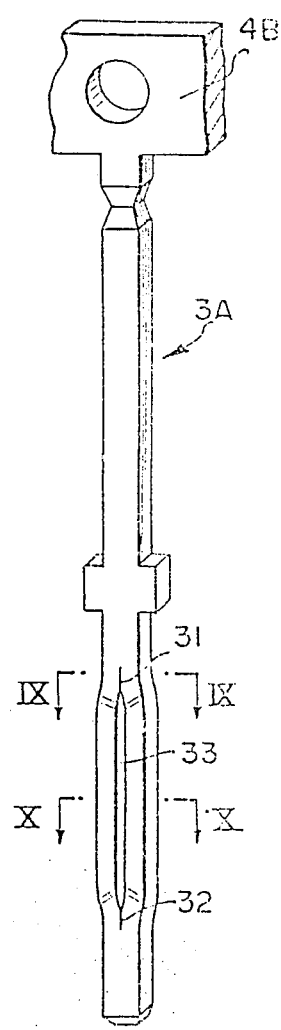
FIG. 2
FIG. 3
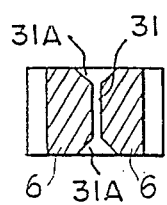
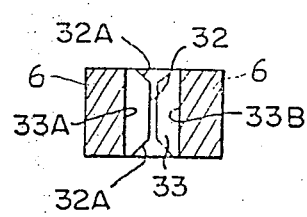

FIG. 13
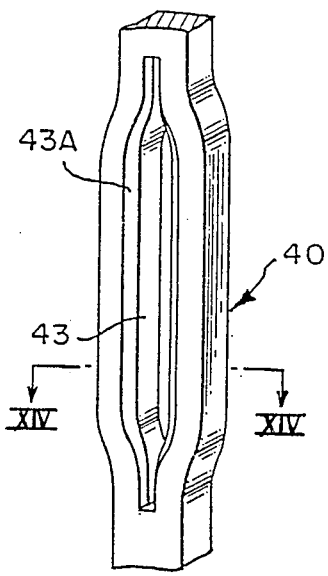
FIG. 14
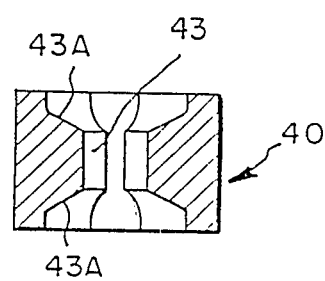
PRIOR ART
FIG. 15
PRIOR ART
FIG. 16
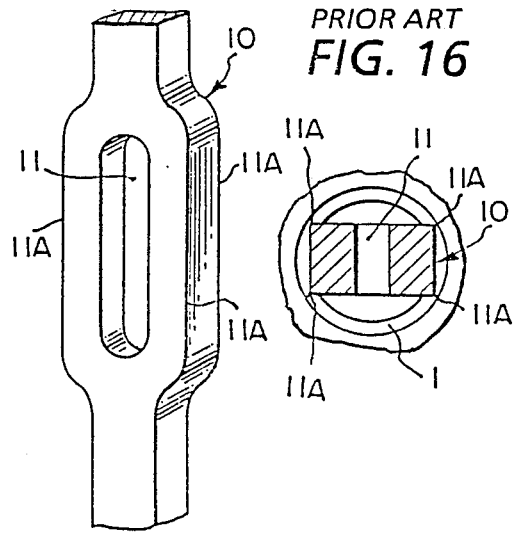
PRIOR ART
FIG. 17
PRIOR ART
FIG. 18
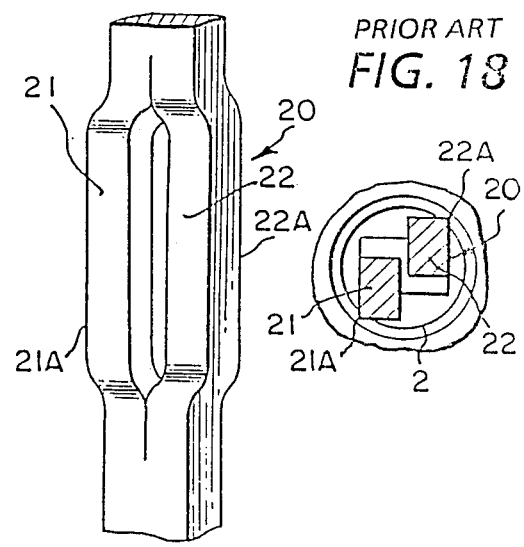

ELECTRICAL CONTACT PIN

CROSS-REFERENCE TO RELATED APPLICATIONS

This application is a continuation of Ser. No. 857,948 filed May 1, 1986.

BACKGROUND OF THE INVENTION

The present invention relates to electrical contact pins and, more particularly, to an electrical contact pin having a compliant part.

Electrical contact pins having a compliant part to be fitted into a plated hole of a printed circuit board for mechanical fixation and electrical connection thereto are well known. FIGS. 15 and 17 show two examples of conventional compliant electrical contact pins.

The electrical contact pin of FIG. 15, so called "eye of the needle" compliant pin, is made by stamping from a sheet of springy conductive metal so that it has an opening 11 at the center of a compliant part 10 to give a spring property to the compliant part. As FIG. 16 shows this compliant part is fitted into a plated aperture 1 of a circuit board so that its four corners 11A elastically cut into the conductive wall of the plated aperture 1 for mechanical fixation and electrical connection thereto.

The electrical contact pin of FIG. 17 is made by first stamping out a compliant part 20 from a sheet of springy conductive metal. Then, the compliant part 20 is sheared to form a pair of legs 21 and 22. These legs are then offset with respect to each other along the shear plane so as to give a spring property to the compliant part. As FIG. 18 shows, the compliant part is fitted into a plated aperture 2 of a circuit board so that a corner 21A of the offset leg 21 and a corner 22A of the offset leg 22 elastically cut into the conductive wall of the plated aperture 2 for meachincal fixation and electrical connection.

Recently, electronic parts are densely mounted on a circuit board, and the diameter of plated apertures has become smaller than before. Consequently, there is a need to make the compliant part of an electrical contact pin smaller than before. However, it is practically impossible to punch out an opening 11 having a diameter of less than about 0.60 mm (0.024 inch) in the compliant part of an eye of the needle compliant pin of FIGS. 15 and 16. Although the compliant part of a contact pin of FIGS. 17 and 18 is relatively well fitted into a small aperture, there are only two points in contact with the conductive wall of a plated aperture, as shown in FIG. 18, and the contact pin tends to turn in fitting operation. Consequently, the fitting operation requires an extra force to counter the turning force.

SUMMARY OF THE INVENTION

Accordingly, it is an object of the invention to provide an electrical contact pin useful for an easy to fit into a small plated aperture of a circuit board.

According to the invention there is provided an electrical contact pin haing a compliant part to be fitted into a plated aperture having a diameter of no more than about 0.94 mm (0.037 inch). The compliant part consists of a pair of elongated legs coming together at opposite shear ends and having generally straight inside walls which are not offset with respect to each other along a shear plane and define a thin slot. The thin slot has a length and a width greater than those of the shear ends.

An advantage of the invention is that the the width of the thin slot so small that the outside diameter of the compliant part of a contact pin is sufficiently small to fit into a plated aperture as small as no more than 0.94 mm.

Other objects, features, and advantages of the invention will be apparent from the following description taken in conjunction with the accompanying drawings.

BRIEF DESCRIPTION OF THE DRAWINGS

FIG. 1 is a perspective view of an electrical contact pin embodying the present invention;

FIGS. 2 and 3 are sectional views taken along the lines II—II and III—III, respectively, of FIG. 1;

FIGS. 4 through 11 illustrate a method of making the electrical contact pin of FIG. 1;

FIG. 13 is a perspective view of another embodiment of the compliant part of an electrical contact pin according to the invention;

FIG. 14 is a sectional view taken along the line XIV—XIV of FIG. 13;

FIG. 15 is a perspective view of an electrical contact pin according to the prior art;

FIG. 16 is a sectional view of the compliant part of the contact pin of FIG. 15, which is fitted into a plated aperture;

FIG. 17 is a perspective view of another electrical contact pin according to the prior art; and FIG. 18 is a sectional view of the compliant part of the contact pin of FIG. 17, which is fitted into a plated aperture.

DESCRIPTION OF THE PREFERRED EMBODIMENTS

Figure 5:
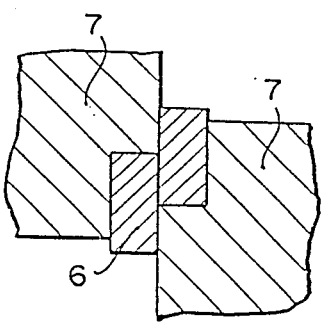

In FIGS. 1, 2, and 3, an electrical contact pin 3 consists of a head 26, a shoulder 28, and a fixing or compliant part 30 to be fitted into a plated aperture. The compliant part 30 has a pair of elongated legs 6 to define a thin slot 33 with shear ends 31 and 32 at its upper and lower ends. Facing inside walls 33A and 33B of the elongated legs 6 are not offset with respect to each other along the shear plane. The shear ends 31 and 32 are coined at 31A and 32A, respectively, for making a fine adjustment of the slot width. The elongated leg 6 has a long straight central portion, a pair of short curved portion, and a pair of short straight shear end portions at which two legs join together.

FIGS. 4 through 11 illustrate how to make the electrical contact pin of FIG. 1.

In FIG. 4A, an array of rectangular openings 5 are punched out from a sheet of springy conductive metal 4 to form an elongated portion 6 having a rectangular crosssection, the diagonal length of which is less than the diameter of a plated aperture into which the finished compliant part is to be fitted.

Figure 6:
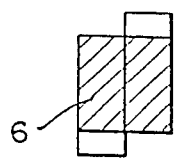
Figure 7:
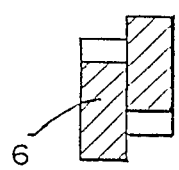

In FIG. 5, the elongated portion 6 is sheared in the axial direction to form a pair of elongated legs 6 which are offset with respect to each other along the shear plane. FIG. 6 shows in section the resulting shear end portion, and FIG. 7 shows in section the offset elongated leg portion.

Figure 8:
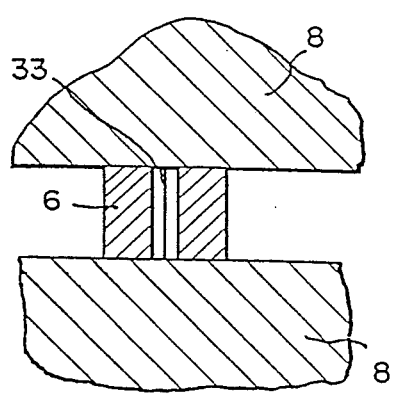

In FIG. 8, the offset elongated legs 6 are pressed between press elements 8 so that they return to the plane of the sheet material 4 and expand outwardly to such an extent that the elongated legs have been offset with respect to each other along the shear plane. The result is a thin slot 33 produced between the two elongated legs 6, as shown in the Figure, so that the diagonal length of cross-section of the elongated legs 6 becomes greater than the diameter of a plated aperture.

Figure 9:
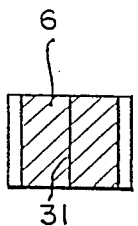
Figure 10:
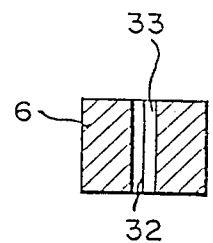

In FIG. 4B, by cutting the metal sheet along a dotted line 4A of FIG. 4A, a pin element 3A connected to a strip 4B is formed. FIGS. 9 and 10 show in section the shear end portion and the expanded straight leg portion, respectively. It is noted that the short shear ends 31 and 32, which have been made by the shearing operation, remain at the upper and lower ends of the long thin slot 33.

Figure 11:
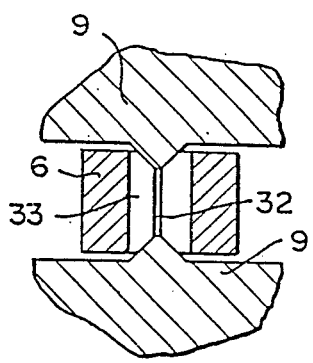

In FIG. 11, the shear ends 31 and 32 are coined by means of press elements 9 to adjust the width of the thin slot 33 and, in turn, the diagonal length of cross-section of the elongated legs 6.

Finally, the pin element 3A is severed from the strip 4B to complete a contact pin 3 with a compliant part 30 as shown in FIG. 1.

Figure 12:
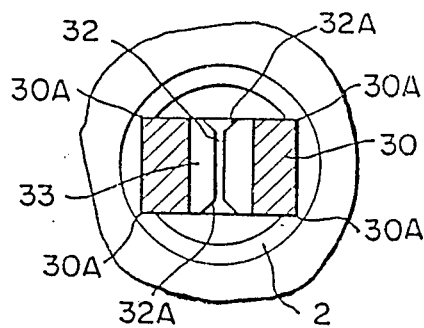
FIG. 12 is a sectional view of the compliant part of the contact pin fitted into a plated aperture.

FIG. 12 shows the compliant part 30 in section which is fitted into a plated aperture 2. Four corners 30A of the compliant part uniformly cut into the conductive wall of the plated aperture 2.

FIG. 13 shows another embodiment of the electrical contact pin according to the invention. This compliant part 40 is identical with that of contact pin 3 of FIG. 1 except that the inside edges 43A of each leg 6 are conined as well as the upper and lower shear ends by means of suitably shaped press elements. The shape of a compliant part may be changed by using differently shaped press elements.

According to the invention, the width of a thin slot formed at the center of a compliant part of a contact pin is so small that the outside diameter of the compliant part is sufficiently small to fit into a plated aperture as small as about 0.6 mm in diameter. When fitted into a plated aperture, the four corners of the compliant part cut into the inside wall of the plated aperture so that the forces to be applied are balanced, making the fitting operation easier and the resultant electrical and mechanical connection better than before. In addition to the compliant property of the legs, the shear ends at the upper and lower ends of a thin slot are compressed inwardly, thus facilitating the fitting operation and reducing the possibility of damaging the plated aperture.

While a preferred embodiment of the invention has been described using specific terms, it is to be understood that changes and variations may be made without departing from the spirit and scope of the invention as recited in the appended claims.

I claim:

1. An electrical contact pin having a compliant part to be fitted into a plated aperture having a diameter of no more than about 0.94 mm (0.037 inch); said compliant part comprising;

a pair of opposed elongated outwardly bowed legs which have been sheared apart, whose ends are joined to respective ends of said pin, said legs being separated by a slot, said legs each having a central portion and end portions which are parallel to the longitudinal axis of said pin, said central portions being spaced farther apart outwardly than said end portions, said central portion of each said leg being joined to its respective said end portions by curved segments, said slots having ends which extend longitudinally beyond said curved segments, said slot ends separating said end portions at both of said pin ends so that they do not abut one another.

2. An electrical contact pin as recited in claim 1, wherein said end portions are coined.

3. An electrical contact pin as recited in claim 2, wherein said central portions are coined.

* * * * *